(12) United States Patent
Chiu et al.

(10) Patent No.: US 7,586,742 B2
(45) Date of Patent: Sep. 8, 2009

(54) HEAT DISSIPATION MODULE

(75) Inventors: Yung-Yu Chiu, Taoyuan Hsien (TW); Te-Tsai Chuang, Taoyuan Hsien (TW); Kuo-Cheng Lin, Taoyuan Hsien (TW); Wen-Shi Huang, Taoyuan Hsien (TW)

(73) Assignee: Delta Electronics Inc., Taoyuan Hsien (TW)

( * ) Notice: Subject to any disclaimer, the term of this patent is extended or adjusted under 35 U.S.C. 154(b) by 18 days.

(21) Appl. No.: 11/268,515

(22) Filed: Nov. 8, 2005

(65) Prior Publication Data

US 2006/0146494 A1 Jul. 6, 2006

(30) Foreign Application Priority Data

Dec. 30, 2004 (TW) .............................. 93141435 A

(51) Int. Cl.
*H05K 7/20* (2006.01)
*H05K 5/00* (2006.01)
*H05K 7/00* (2006.01)

(52) U.S. Cl. .............................. 361/679.5; 361/679.49; 361/679.51; 174/15.1; 174/16.1

(58) Field of Classification Search ......... 361/392–695, 361/387, 717, 718, 722, 737, 741; 174/15.1, 174/15.2, 16.1, 16.3; 165/80.2, 80.3
See application file for complete search history.

(56) References Cited

U.S. PATENT DOCUMENTS

| | | | | |
|---|---|---|---|---|
| 6,108,203 A | * | 8/2000 | Dittus et al. | ................ 361/695 |
| 6,522,539 B2 | * | 2/2003 | Ota et al. | ..................... 361/695 |
| 6,771,497 B2 | * | 8/2004 | Chen et al. | ................... 361/687 |
| 7,128,526 B2 | * | 10/2006 | Paulsen | ...................... 415/146 |
| 2004/0057205 A1 | * | 3/2004 | Chen et al. | ................... 361/687 |
| 2005/0094371 A1 | * | 5/2005 | Lai | ............................ 361/687 |
| 2006/0056964 A9 | * | 3/2006 | Tamagawa et al. | .......... 415/206 |
| 2006/0081366 A1 | * | 4/2006 | Chiu et al. | .................. 165/296 |
| 2006/0081367 A1 | * | 4/2006 | Chiu et al. | .................. 165/296 |
| 2006/0087814 A1 | * | 4/2006 | Brandon et al. | ............. 361/694 |
| 2007/0004327 A1 | * | 1/2007 | Tao et al. | ..................... 454/184 |

* cited by examiner

*Primary Examiner*—Jayprakash N Gandhi
*Assistant Examiner*—Anthony M Haughton
(74) *Attorney, Agent, or Firm*—Birch, Stewart, Kolasch & Birch, LLP

(57) ABSTRACT

A heat dissipation module includes a first heat dissipation apparatus, a second heat dissipation apparatus, at least one first flapper and at least one second flapper. The first heat dissipation apparatus has a first airflow passage, and the second heat dissipation apparatus has a second airflow passage. The first flappers and the second flappers are separately disposed within the first airflow passage and the second airflow passage. The first flappers and the second flappers are moved to an open position due to force generated by air flowing through the first airflow passage and the second airflow passage, and are moved to a closed position after the force is removed.

23 Claims, 5 Drawing Sheets

HEAT DISSIPATION MODULE

This Non-provisional application claims priority under U.S.C. §119(a) on Patent Application No(s). 093141435 filed in Taiwan, Republic of China on Dec. 30, 2004, the entire contents of which are hereby incorporated by reference.

BACKGROUND

The invention relates to a heat dissipation module, and in particular to a heat dissipation module capable of increasing the dissipation area and preventing reverse airflow.

As efficiency of electronic devices increase rapidly, heat dissipation modules have become essential components for the electronic devices. Electronic devices will become inefficient or burn out if the heat generated by the electronic device is not efficiently dissipated. Particularly, heat dissipation apparatuses are critical to microelectronic elements, such as integrated circuits. As integration increases and package technology improves, size of the ICs is reduced, and heat accumulated in the unit area thereof increases relatively. Thus, high efficiency heat dissipation modules are the object of constant research in the electronics industry.

Generally, ventilation, convection or heat dissipation in a heat generating system such as a server, a computer, an electronic mechanism or a power supply is facilitated by a heat dissipation apparatus, such as an axial flow fan, or a centrifugal fan. The heat dissipation apparatus can guide air flow to dissipate heat generated by the electronic devices to the environment for performing heat dissipation or air convection.

FIG. 1A is a schematic view of a conventional heat dissipation module. The conventional heat dissipation module 10 comprises a first blower 110 and a second blower 120. The first blower 110 and the second blower 120 are separated by a side wall 14 so that the airflow in the first blower 110 and the second blower 120 can be discharged through the outlet 111 and the outlet 121 of the first blower 110 and the second blower 120 respectively.

The heat dissipation module 10, however, is a plug-in module, and independent from the heat source. As shown in FIG. 1A, because the first blower 110 is disposed in front of the second blower 120, there is a space C existing in the first blower 110 near the second blower 120. The space C provides enough space for air to flow in reverse. When the first blower 110 operates, turbulent flow occurs at the space C in the first blower 110, which reduces the efficiency of the first blower 110 during operation.

Further, the length and the width of the airflow passage of the first blower 110 are different from the length and the width of the airflow passage of the second blower 120 such that the outlet 111 and the outlet 121 have different pressure. That is, the air pressure at the outlet 111 is much smaller than the air pressure at the outlet 121 when the blower 110 and the blower 120 are in operation. Thus, turbulent flow occurs at the border between the outlet 111 and the outlet 121 so that the dissipation efficiency of the heat dissipation module 10 is greatly affected.

Additionally, FIG. 1B illustrates the heat dissipation module 10 in FIG. 1A, in which one of the fans malfunctions. For example, when the second blower 120 malfunctions, only the first blower 110 operates so that air is only discharged through the outlet 111. Because the outlet 121 of the second blower 120 is directly communicated with the external environment, the air flows freely in and out through the outlet 121. Under this circumstance, the air flows in reverse into the second blower 120, such that the accumulation of hot air in the second blower 120 may affect the first dissipation apparatus 110. Thus, the entire dissipation efficiency of the heat dissipation module 10 is reduced.

SUMMARY

Accordingly, to solve the above-mentioned problem, the present invention discloses a heat dissipation module capable of increasing the dissipation area and preventing reverse airflow. An exemplary embodiment of a heat dissipation module includes a first heat dissipation apparatus, a second heat dissipation apparatus. The first heat dissipation has a first housing, a first airflow passage disposed in the first housing, and at least one first flapper disposed in the first airflow passage, the second heat dissipation has a second housing, a second airflow disposed in the second housing, and at least one second flapper disposed in the second airflow passage. The first flappers and the second flappers are respectively disposed within the first airflow passage and the second airflow passage. The first flappers and the second flappers are moved to an open position due to force generated by air through the first airflow passage and the second airflow passage, and the first flappers and the second flappers are moved to a closed position after the force is removed.

The first heat dissipation apparatus and the second heat dissipation apparatus are preferably two blowers, and are symmetrically disposed in a mirror-image arrangement. Each of the first heat dissipation apparatus and the second heat dissipation apparatus has an impeller respectively, and the rotating direction of the impeller of the first heat dissipation apparatus is different from that of the impeller of the second heat dissipation apparatus. When the first heat dissipation apparatus malfunctions, the first flappers are moved to the closed position so as to seal the first airflow passage of the first heat dissipation apparatus and prevent air from flowing in reverse into the first heat dissipation apparatus through the first airflow passage. Conversely, when the second heat dissipation apparatus malfunctions, the second flappers are moved to the closed position so as to seal the second airflow passage of the second heat dissipation apparatus and prevent air from flowing in reverse into the second heat dissipation apparatus through the second airflow passage.

The heat dissipation module further includes at least one limiting member disposed adjacent to the first flappers or the second flappers so that movements of the first flappers or the second flappers are restricted between the open position and the closed position. Each of the limiting members is such as a railing, a cleat, a ramp, a bump, a frame, a blocker, a shaft, a bolt or other equivalent member.

The heat dissipation module further includes a bias element disposed adjacent to the first flappers or the second flappers so that the first flappers or the second flappers are moved to the closed position by the bias elements. The first flappers and the second flappers are rotatably disposed, and are separately disposed horizontally or vertically in the first airflow passage and the second airflow passage. The first flappers and the second flappers may be disposed in the first airflow passage and the second airflow passage by axial disposal, coaxial disposal, modular disposal, direct disposal on axis, engagement or other equivalent rotative structures. Further, the first flappers and the second flappers are pivotably disposed on a top wall, a side wall or a bottom wall of the first airflow passage and the second airflow passage respectively.

The first flapper and the second flapper include material of mylar, acrylic fiber, fiberglass, resin, polycarbonate, or other light-weight materials.

DESCRIPTION OF THE DRAWINGS

The invention can be more fully understood by reading the subsequent detailed description and examples with references made to the accompanying drawings, wherein.

DETAILED DESCRIPTION

Figure 1A:
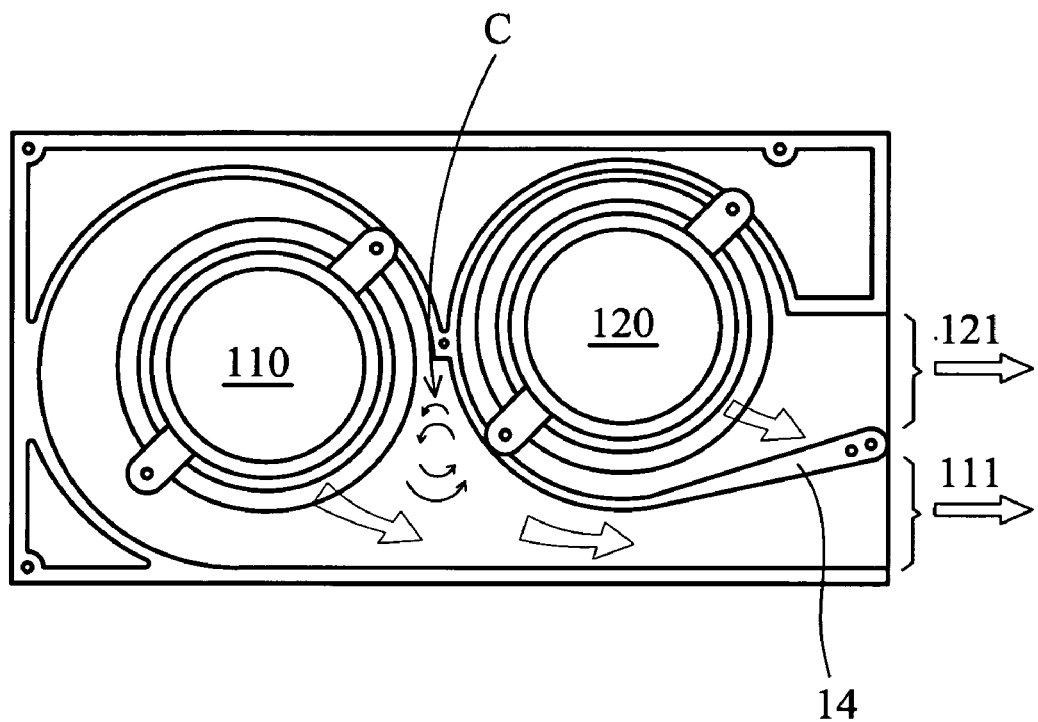
FIG. 1A is a schematic view of a conventional heat dissipation module.
Figure 1B:
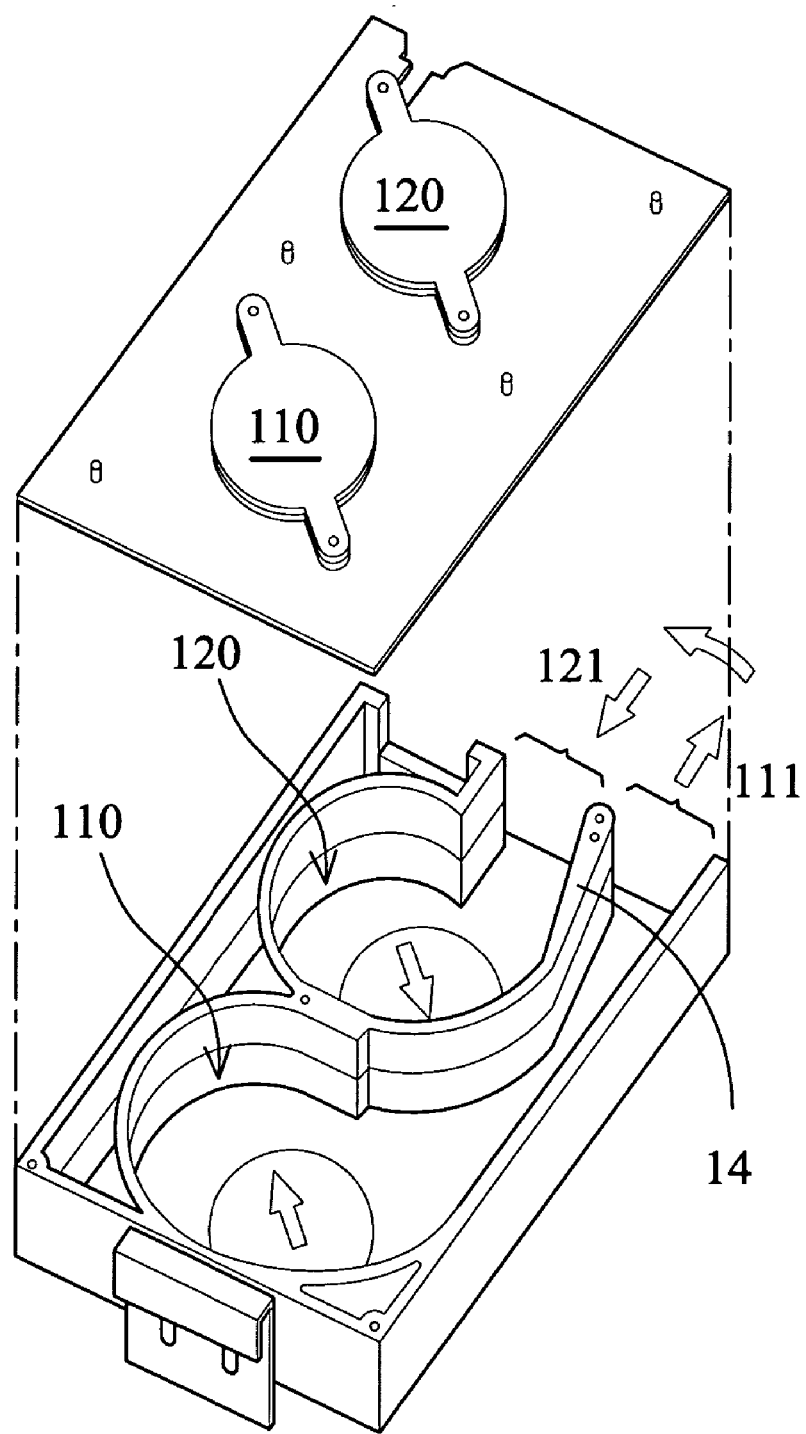
FIG. 1B is a schematic view of an air flow field of the heat dissipation module, in which one of the blowers malfunctions.
Figure 2A:
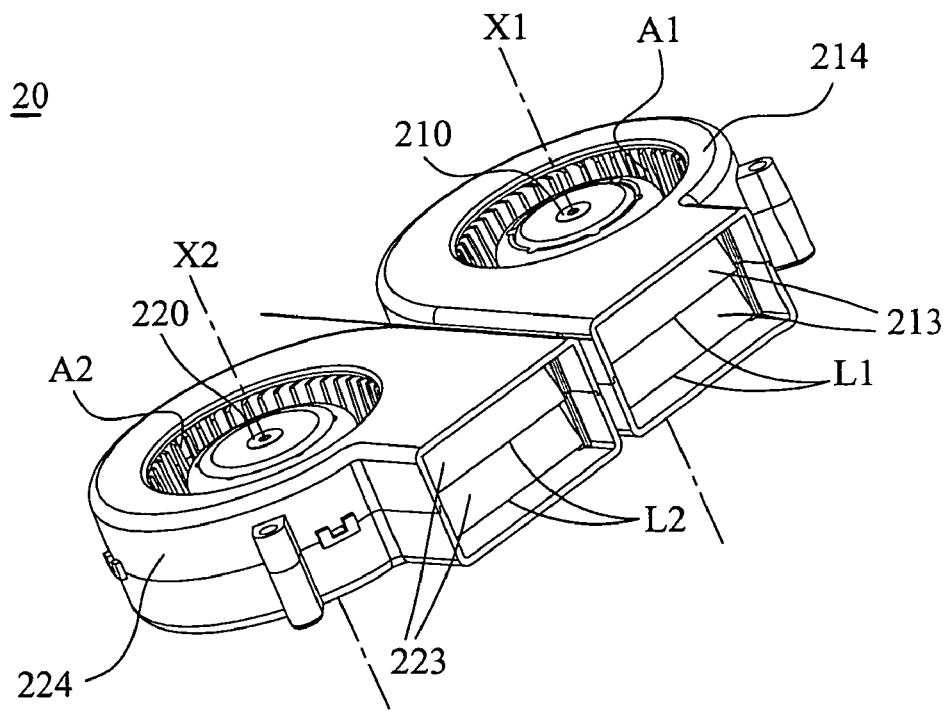
FIG. 2A is a schematic view of an embodiment of a heat dissipation module, in which two fans are not in operation.
Figure 2B:
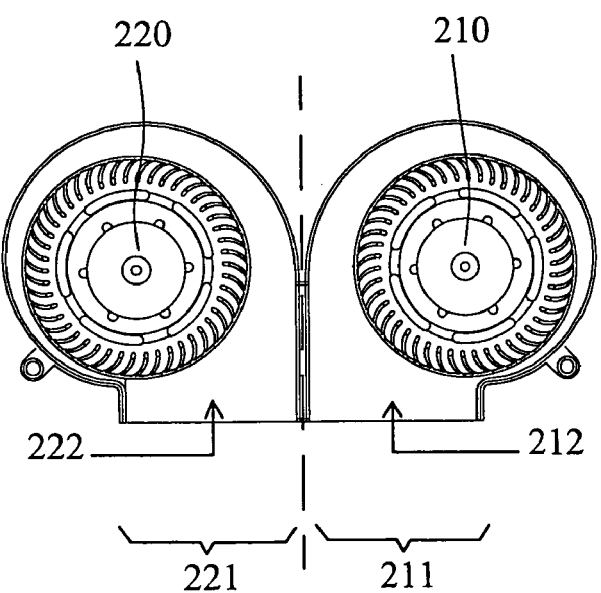
FIG. 2B is a top view of the heat dissipation module in FIG. 2A, in which two fans are not in operation.

Referring to FIG. 2A and FIG. 2B, FIG. 2A is a schematic view of an embodiment of a heat dissipation module, in which two fans are not in operation, and FIG. 2B is a top view of the heat dissipation module in FIG. 2A, in which two fans are not in operation. For simplicity, an upper cover of the heat dissipation module is removed in FIG. 2B. An embodiment of a heat dissipation module 20 includes a first heat dissipation apparatus 210, a second heat dissipation device 220. The first heat dissipation has a first housing 214, a first airflow passage 213 disposed in the first housing 214, and at least one first flapper 213 disposed in the first airflow passage 212, the second heat dissipation has a second housing 224, a second airflow passage 222 disposed in the second housing 224, and at least one second flapper 223 disposed in the second airflow passage 222. The heat dissipation module 20 is preferably a parallel fan module and may include more than two fans. The first heat dissipation apparatus 210 and the second heat dissipation apparatus 220, such as blowers, respectively have a first airflow passage 212 and a second airflow passage 222. Each of the first heat dissipation apparatus 210 and the second heat dissipation apparatus 220 has a complete airflow passage so that the first heat dissipation apparatus 210 and the second heat dissipation apparatus 220 respectively have an air flow field independent from the other, whereby preventing disturbance and turbulent flow. Thus, the dissipation efficiency of the heat dissipation module 20 is not reduced.

The first heat dissipation apparatus 210 and the second heat dissipation apparatus 220 are symmetrically disposed in a mirror-image arrangement according to an imaginary line between the first heat dissipation apparatus 210 and the second heat dissipation apparatus 220 (as indicated by the dotted line). The first heat dissipation apparatus 210 has a first impeller A1 with a first axis X1, and the second heat dissipation device 220 has a second impeller A2 with a second axis X2, and the rotating direction of the first impeller A1 of the first heat dissipation apparatus 210 is different from that of the second impeller A2 of the second heat dissipation apparatus 220.

Figure 3A:
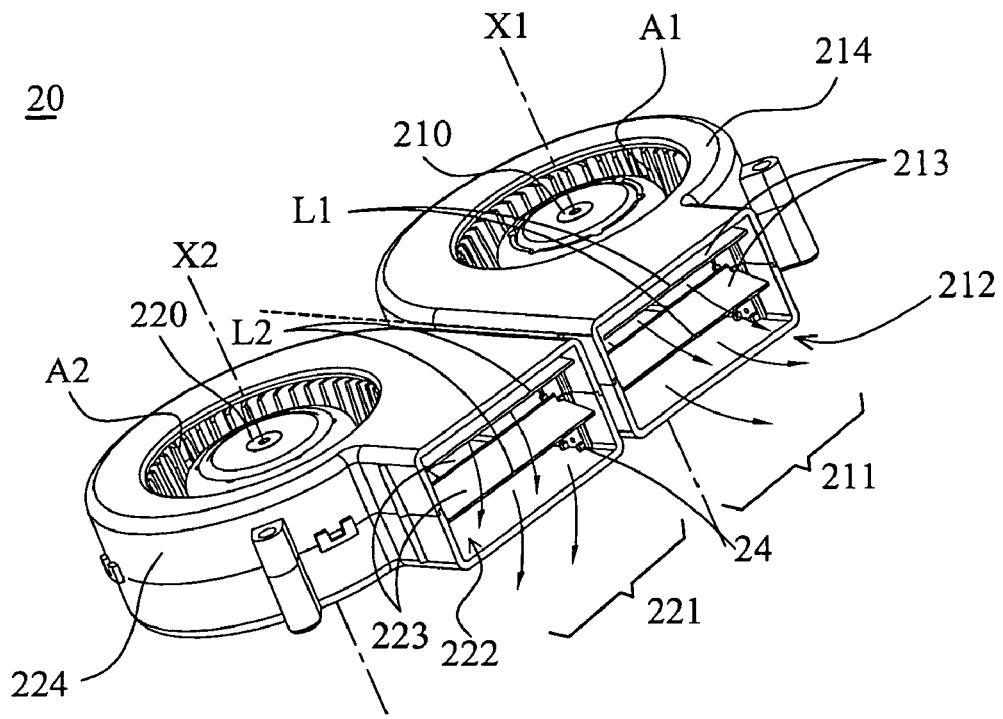
FIG. 3A is a schematic view of the heat dissipation module in FIG. 2A, in which two fans are in operation.
Figure 3B:
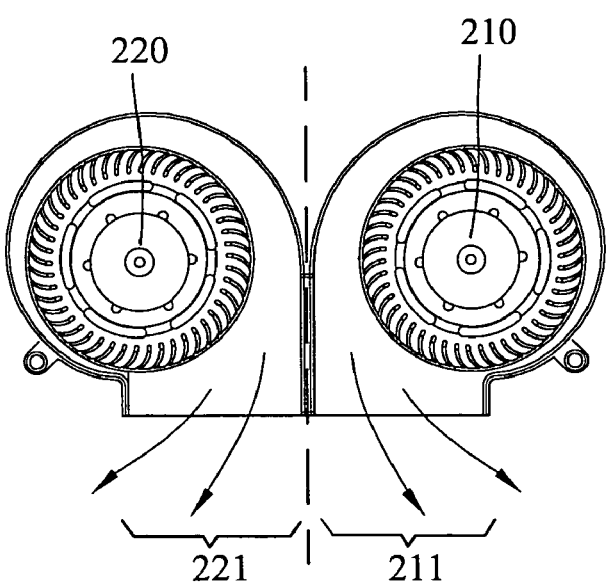
FIG. 3B is a top view of the heat dissipation module in FIG. 2A, in which two fans are in operation.

Referring to FIG. 3A and FIG. 3B, FIG. 3A is a schematic view of the heat dissipation module in FIG. 2A, in which two fans are in operation, and FIG. 3B is a top view of the heat dissipation module in FIG. 2A, in which two fans are in operation. When the fan is in operation, the air flows along the direction of involute according the rotating orientation. In this case, two symmetrical blowers are assembled in a module, and when the impeller of the first heat dissipation apparatus 210 rotates counterclockwise, and the impeller of the second heat dissipation device 220 rotates clockwise, air produced by the first heat dissipation apparatus 210 and the second heat dissipation apparatus 220 respectively flows along the direction of involute (as indicated by the lines with arrows) and through the outlet 211 and the outlet 221. As the result, the entire dissipation area of the heat dissipation module 20 is not only limited to the size of the sum of the outlet 211 and the outlet 221, and are expanded. Therefore, the dissipation effect of the heat dissipation module 20 is improved.

Also, referring now to FIGS. 2A, 2B, 3A, and 3B, FIG. 3A is a schematic view of an embodiment of a heat dissipation module, in which two fans are in operation. There are several first flappers 213 and second flappers 223 respectively disposed in the first airflow passage 212 and the second airflow passage 222, and are respectively disposed near the outlets 211, 221 of the first heat dissipation apparatus 210 and the second heat dissipation apparatus 220. The first flappers 213 are rectangular and long sides L1 of the first flappers 213 are perpendicular to the first axis X1. The second flappers 223 are rectangular and long sides L2 of the second flappers 223 are perpendicular to the second axis X2. When the first heat dissipation apparatus 210 and the second heat dissipation apparatus 220 are not in operation, the first flappers 213 and the second flappers 223 are in the closed position due to the gravity force or other special design (for example, a bias element), as shows in FIG. 2A.

The bias element (not shown) can be disposed adjacent to the first flappers 213 or the second flappers 223 so that the first flappers 213 or the second flappers 223 are moved back to the closed position by the bias element from the open position when the external force does not exist.

When the first heat dissipation apparatus 210 and the second heat dissipation apparatus 220 are in operation, the air in the first heat dissipation apparatus 210 and the second heat dissipation apparatus 220 is discharged through the outlet 211 and the outlet 221, respectively. The first flappers 213 and the second flappers 223 at the outlet 211 and the outlet 221 are moved to the open position respectively due to the force generated by the air flowing along the first airflow passage 212 and the second airflow passage 222, as shown in FIG. 3A.

Figure 4A:
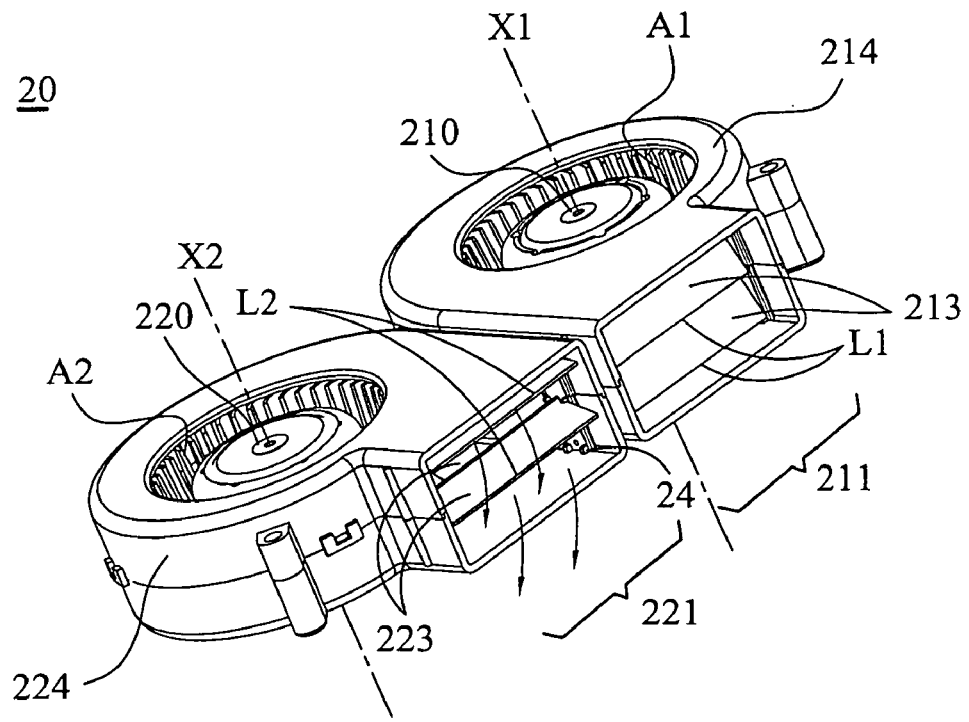
FIG. 4A is a schematic view of the heat dissipation module in FIG. 2A, in which one of the fans malfunctions.
Figure 4B:
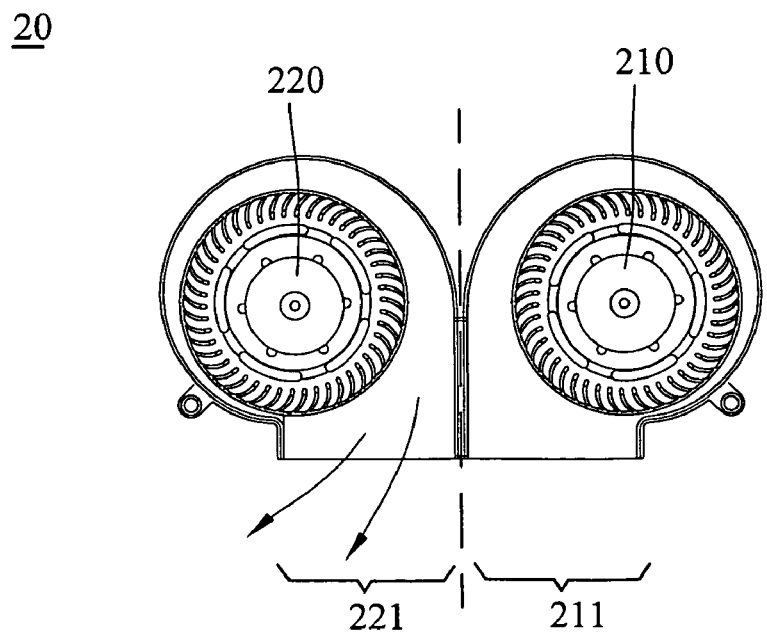
FIG. 4B is a top view of the heat dissipation module in FIG. 2A, in which one of the fans malfunctions.

Referring to FIG. 4A and FIG. 4B, FIG. 4A is a schematic view of the heat dissipation module in FIG. 2A, in which one of the fans malfunctions, and FIG. 4B is a top view of the heat dissipation module in FIG. 2A, in which one of the fans malfunctions. For example, when the first heat dissipation apparatus 210 malfunctions, only the second heat dissipation apparatus 220 is in operation. The second flappers 223 are pushed to the open position by the external force generated by air flowing through the outlet 221, but the first flappers 213 are still in the closed position and seal the outlet 211 of the first heat dissipation apparatus 210. Therefore, the first flappers 213 in the close position prevent external air from flowing in reverse into the first airflow passage 212. Thus, the external air cannot flow in reverse into the first heat dissipation apparatus 210 through the outlet 211, and the accumulation of hot air in the first heat dissipation apparatus 210 may not happened.

Also, each of the first flapper 213 partially overlaps an adjacent first flapper to cooperatively seal the first heat dissipation apparatus 210. However, the number of the first flappers 213 is not limited as long as the first flappers 213 can seal the first heat dissipation apparatus 210. For example, even only one flapper is also capable of being using to seal the outlet and prevent revise air flowing into the malfunctioned heat dissipation apparatus.

In another case, when the second heat dissipation apparatus 220 malfunctions, only the first heat dissipation apparatus 210 is in operation. The first flappers 213 are pushed to the open position by the external force generated by air flowing through the outlet 211, but the second flappers 223 are still in the closed position and seal the outlet 221 of the second heat dissipation 220. Therefore, the second flappers 223 in the close position prevent external air from flowing in reverse into the second airflow passage 222. Thus, the external air cannot flow in reverse into the second heat dissipation apparatus 220 through the outlet 221, and the accumulation of hot air in the second heat dissipation apparatus 220 may not happened.

Each of the second flapper 223 partially overlaps an adjacent second flapper to cooperatively seal the second heat dissipation apparatus 220. However, the number of the second flappers 223 is not limited as long as the second flappers 223 can seal the second heat dissipation apparatus 220. For example, even only one flapper is also capable of being using to seal the outlet and prevent revise air flowing into the malfunctioned heat dissipation apparatus.

Further, the first flappers 213 and the second flappers 223 are rotatably disposed and are pivotably disposed horizontally or vertically in a detachable manner in the first airflow passage 212 and the second airflow passage 222 such as on a top wall, a side wall, or a bottom wall of the passage, respectively. Thus, the first flappers 213 and the second flappers 223 are able to move to the open position or the closed position flexibly. Or, the first flapper 213 and the second flapper 223 are disposed in the first airflow passage 212 and the second airflow passage 222 by axial disposal, coaxial disposal, modular disposal, direct disposal on axis, engagement or other equivalent rotative structures. The first flappers 213 and the second flappers 223 are made of material like mylar, acrylic fiber, fiberglass, resin, polycarbonate, or other lightweight materials.

Additionally, at least one limiting member 24 is used and disposed on a top wall, a side wall, a bottom wall of the passage, or any other suitable locations, as shown in FIG. 3A or FIG. 4A. The limiting members 24 are disposed adjacent to the first flappers 213 and the second flappers 223 so that the movements of the first flappers 213 and the second flappers 223 are restricted between the open position and the closed position. Each of the limiting members 24 is a railing, a cleat, a ramp, a bump, a frame, a blocker, a shaft, a bolt or other equivalent member.

In conclusion, the heat dissipation module expands the dissipation area and prevents reverse air, whereby enhancing the dissipation efficiency of the module. Since the turbulent flow generally occurs in the traditional heat dissipation fans, the present invention can solve the problem by designing two symmetrical blowers, each of which has a complete independent passage with an air flow field independent from the other, whereby preventing disturbance and turbulent flow.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A heat dissipation module, comprising:
a first heat dissipation apparatus having a first housing, a first impeller having a first axis, a first airflow passage disposed in the first housing and a plurality of first flappers disposed within the first airflow passage, wherein a long side of the first flapper is perpendicular to the first axis; and
a second heat dissipation apparatus having a second housing, a second impeller having a second axis, a second airflow passage disposed in the second housing and a plurality of second flappers disposed within the second airflow passage, wherein a long side of the second flapper is perpendicular to the second axis;
wherein the first flappers and the second flappers are moved to an open position due to force generated by air flowing through the first airflow passage and the second airflow passage, and are moved to a closed position after the force is removed,
wherein each of the first flappers overlaps an adjacent first flapper to seal the entire first airflow passage of the first heat dissipation apparatus and each of the second flappers overlaps an adjacent second flapper to seal the entire second airflow passage of the second heat dissipation apparatus; and the first housing and the second housing are disposed in a mirror-image arrangement.

2. The heat dissipation module as claimed in claim 1, wherein the first heat dissipation apparatus and the second heat dissipation apparatus are blowers.

3. The heat dissipation module as claimed in claim 1, wherein when the first heat dissipation apparatus malfunctions, the first flappers are moved to the closed position, closing the first heat dissipation apparatus to prevent the air from flowing in reverse into the first airflow passage.

4. The heat dissipation module as claimed in claim 1, wherein when the second heat dissipation apparatus malfunctions, the second flappers are moved to the closed position, closing the second heat dissipation apparatus to prevent the air from flowing in reverse into the second airflow passage.

5. The heat dissipation module as claimed in claim 1, further comprising at least one limiting member disposed adjacent to the first flappers so that movements of the first flappers are restricted between the open position and the closed position.

6. The heat dissipation module as claimed in claim 5, wherein each of the limiting members is a railing, a cleat, a ramp, a bump, a frame, a blocker, a shaft, a bolt or other equivalent member.

7. The heat dissipation module as claimed in claim 1, further comprising at least one limiting member disposed adjacent to the second flappers so that movements of the second flappers are restricted between the open position and the closed position.

8. The heat dissipation module as claimed in claim 7, wherein each of the limiting members is a railing, a cleat, a ramp, a bump, a frame, a blocker, a shaft, a bolt or other equivalent member.

9. The heat dissipation module as claimed in claim 1, wherein the first flappers and the second flappers are rotatably disposed, and are disposed horizontally or vertically in the first airflow passage and the second airflow passage respectively.

10. The heat dissipation module as claimed in claim 1, wherein the first flappers and the second flappers are disposed in the first airflow passage and the second airflow passage by axial disposal, coaxial disposal, modular disposal, direct disposal on axis, engagement or other equivalent rotative structures.

11. The heat dissipation module as claimed in claim 1, wherein the first flappers and the second flappers are pivotably disposed on a top wall, a side wall or a bottom wall of the first airflow passage and the second airflow passage respectively.

12. The heat dissipation module as claimed in claim 1, wherein the first flappers and the second flappers are disposed at an outlet of the first airflow passage and the second airflow passage respectively.

13. The heat dissipation module as claimed in claim 1, wherein the first flappers and the second flappers comprise material of mylar, acrylic fiber, fiberglass, resin, polycarbonate, or other light-weight materials.

14. The heat dissipation module as claimed in claim 2, wherein each of the first heat dissipation apparatus and the second heat dissipation apparatus has an impeller, and a rotating direction of the impeller of the first heat dissipation apparatus is different from that of the impeller of the second heat dissipation apparatus.

15. A heat dissipation module, comprising:
a first heat dissipation apparatus having a first housing, a first impeller having a first axis a first airflow passage disposed in the first housing and a plurality of first flappers disposed within the first airflow passage, each of which is moved to the same angle when all of the first flappers are at a closed position wherein a long side of the first flapper is perpendicular to the first axis; and
a second heat dissipation apparatus having a second housing a second impeller having a second axis, a second airflow passage disposed in the second housing and at least one second flapper disposed within the second airflow passages, wherein a long side of second flapper is perpendicular to the second axis;
wherein the first housing and the second housing are disposed in a mirror-image arrangement.

16. The heat dissipation module as claimed in claim 15, wherein the first heat dissipation apparatus and the second heat dissipation apparatus are blowers.

17. The heat dissipation module as claimed in claim 15, wherein the first housing and the second housing are integrally formed as a single piece.

18. The heat dissipation module as claimed in claim 15, wherein each of the first heat dissipation apparatus and the second heat dissipation apparatus has an impeller respectively, and a rotating direction of the impeller of the first heat dissipation apparatus is different from that of the impeller of the second heat dissipation apparatus.

19. The heat dissipation module as claimed in claim 15, wherein
when the first heat dissipation apparatus malfunctions, the first flapper is moved to a first closed position, closing the first heat dissipation apparatus to prevent the air from flowing in reverse into the first airflow passage, and the first closed position is achieved by the first flapper overlapping an adjacent first flapper to seal the first airflow passage of the first heat dissipation apparatus; and
when the second heat dissipation apparatus malfunctions, the second flapper is moved to a second closed position, closing the second heat dissipation apparatus to prevent the air from flowing in reverse into the second airflow passage, and the second closed position is achieved by the second flapper overlapping an adjacent second flapper to seal the second airflow passage of the second heat dissipation apparatus.

20. The heat dissipation module as claimed in claim 19, further comprising:
at least one first limiting member disposed adjacent to the first flapper so that movement of the first flapper is restricted between the open position and the first closed position; and
at least one second limiting member disposed adjacent to the second flapper so that movement of the second flapper is restricted between the open position and the second closed position.

21. The heat dissipation module as claimed in claim 20, wherein each of the first and second limiting members is a railing, a cleat, a ramp, a bump, a frame, a blocker, a shaft, a bolt or other equivalent member.

22. The heat dissipation module as claimed in claim 19, further comprising at least one bias element disposed adjacent to the first flapper or the second flapper, wherein the first flappers or the second flappers are moved to the first or second closed position by the bias element.

23. The heat dissipation module as claimed in claim 15, wherein the first flapper and the second flapper are pivotably disposed on a top wall, a side wall or a bottom wall of the first airflow passage and the second airflow passage, respectively, and the first flapper and the second flapper comprise material of mylar, acrylic fiber, fiberglass, resin, polycarbonate, or other light-weight materials.

* * * * *